US007541887B2

(12) United States Patent
Cheng

(10) Patent No.: US 7,541,887 B2
(45) Date of Patent: Jun. 2, 2009

(54) BALUN

(75) Inventor: Kuang-Wei Cheng, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 101 days.

(21) Appl. No.: 11/608,800

(22) Filed: Dec. 9, 2006

(65) Prior Publication Data

US 2007/0222535 A1 Sep. 27, 2007

(30) Foreign Application Priority Data

Mar. 24, 2006 (TW) .............................. 95110324 A

(51) Int. Cl.
*H01P 5/10* (2006.01)
*H03H 7/42* (2006.01)

(52) U.S. Cl. .......................................... 333/26; 333/25

(58) Field of Classification Search ................... 333/25, 333/26
See application file for complete search history.

(56) References Cited

U.S. PATENT DOCUMENTS 5,949,299 A 9/1999 Harada
6,437,658 B1 8/2002 Apel et al.
6,567,658 B1 5/2003 Van De Graaf
6,954,116 B2 * 10/2005 Nosaka ........................ 333/26
6,998,930 B2 2/2006 Tabatchnick et al.
2004/0164817 A1 8/2004 Nosaka

FOREIGN PATENT DOCUMENTS

JP 2005-244000 * 8/2005
JP 2005-244000 A 9/2005

OTHER PUBLICATIONS

B.P. Kumar et al., Optimized Design of Unique Miniaturized Planar Baluns for Wireless Applications, Feb. 2003, IEEE Microwave and Wireless compoeents Letters, vol. 13 No. 2, 134-136.*
Kumar, et al., Optimized Design of Unique Miniaturized Planar Balums for Wireless Applications, IEEE Microwave and Wireless Componenets Letters, vol. 13, No. 2, Feb. 2003.

* cited by examiner

*Primary Examiner*—Dean O Takaoka
(74) *Attorney, Agent, or Firm*—Wei Te Chung

(57) ABSTRACT

A balun includes a first transforming part (30) and a second transforming part (40). The first transforming part includes a first coupled line (32), a first transmission line (34), a second transmission line (36), and a first capacitor (C1). The first transmission line includes a first balanced port (2). The second transmission line includes a second balanced port (3). The first capacitor connects the first balanced port and the second balanced port. The second transforming part includes a second coupled line (42), a third transmission line (44), a first line node (48), a second capacitor (C2), a fourth transmission line (46), a second line node (49), and a third capacitor (C3). The third transmission line includes an unbalanced port (1). The second capacitor connects the third transmission line and the first line node. The third capacitor connects the fourth transmission line and the second line node.

19 Claims, 5 Drawing Sheets

BALUN

BACKGROUND OF THE INVENTION

1. Field of the Invention

The invention relates to electronic components, and particularly to a balun.

2. Description of Related Art

A balun is a device for transforming signals between a balanced architecture and an unbalanced architecture. The signal of the balanced structure includes two balanced signals with a phase difference of 180 degrees. The signal of the unbalanced architecture includes an unbalanced signal. Thus, the balun can transform the unbalanced signal to the two balanced signals with a 180-degree phase shift and vice versa, i.e., two balanced signals to an unbalanced signal.

The balun is often used in wireless local area networks (WLANs) and mobile communication devices. Due to a desire to make smaller mobile communication devices, the size of the balun needs to be reduced. Recently, transmission line resonators and capacitors are widely used to reduce the size of a transmission line balun. A conventional transmission line balun includes a one-quarter (¼) wavelength balun and a one-sixteenth (1/16) wavelength balun.

FIG. 1 is a schematic diagram of a conventional 1/16 wavelength balun. The conventional balun, disposed on a substrate 50', includes a first transforming part 10 and a second transforming part 20. The first transforming part 10 is symmetrical with respect to a central line thereof. The first transforming part 10 includes a first coupled line 12, a first transmission line 14, a second transmission line 16, and a micro capacitor C1'. A center of the first coupled line 12 includes a ground via. The first transmission line 14, the first coupled line 12, and the second transmission line 16 are connected in series. The first transmission line 14 is bent, and includes a first line node 140 and a balanced port 2'. The second transmission line 16 is bent, and includes a line node 160 and a balanced port 3'. The first line node 140 is connected to the second line node 160 via the micro capacitor c1'.

The second transforming part 20 includes a second coupled line 22, a third transmission line 24, a fourth transmission line 26, a second capacitor C2', and a third capacitor C3'. The third transmission line 24, the second coupled line 22, and the fourth transmission line 26 are connected in series. The third transmission line 24 is bent, and includes a third line node 240 and an unbalanced port 1'. The fourth transmission line 26 is bent, and includes a fourth line node 260. The third line node 240 is connected to the fourth line node 260 via the micro capacitor C2'. The fourth line node 260 is grounded via the micro capacitor C3'. The micro capacitor C2' and the micro capacitor C3' are connected to an end 262 of the fourth line node 260 respectively in two vertical directions.

Lengths of the first coupled line 12 and the second coupled line 22 are 1/16 of a working wavelength of the conventional balun. The size of the conventional balun is relatively large because the micro capacitors C2' and C3' are connected to the end 262 respectively in two vertical directions. In addition, due to the ground via of the first coupled line 12, a length between the first line node 140 and the first coupled line 12 is long. Therefore, the size of the balun cannot be further minimized using a typical layout and structure.

SUMMARY OF THE INVENTION

An exemplary embodiment of the present invention provides a balun. The balun includes a first transforming part and a second transforming part. The first transforming part includes a first coupled line, a first transmission line, a second transmission line, and a first capacitor. The first coupled line includes a first end and a second end. The first transmission line, connected to the first end, includes a first balanced port. The second transmission line, connected to the second end, includes a second balanced port. The first capacitor connects the first balanced port and the second balanced port. The second transforming part includes a second coupled line, a third transmission line, a first line node, a second capacitor, a fourth transmission line, a second line node, and a third capacitor. The second coupled line includes a third end and a fourth end. The third transmission line, connected to the third end, includes an unbalanced port. The second capacitor connects the third transmission line and the first line node. The fourth transmission line is connected to the fourth end. The third capacitor connects the fourth transmission line and the second line node.

Other advantages and novel features will become more apparent from the following detailed description when taken in conjunction with the accompanying drawings, in which:

DETAILED DESCRIPTION OF THE INVENTION

Figure 1:
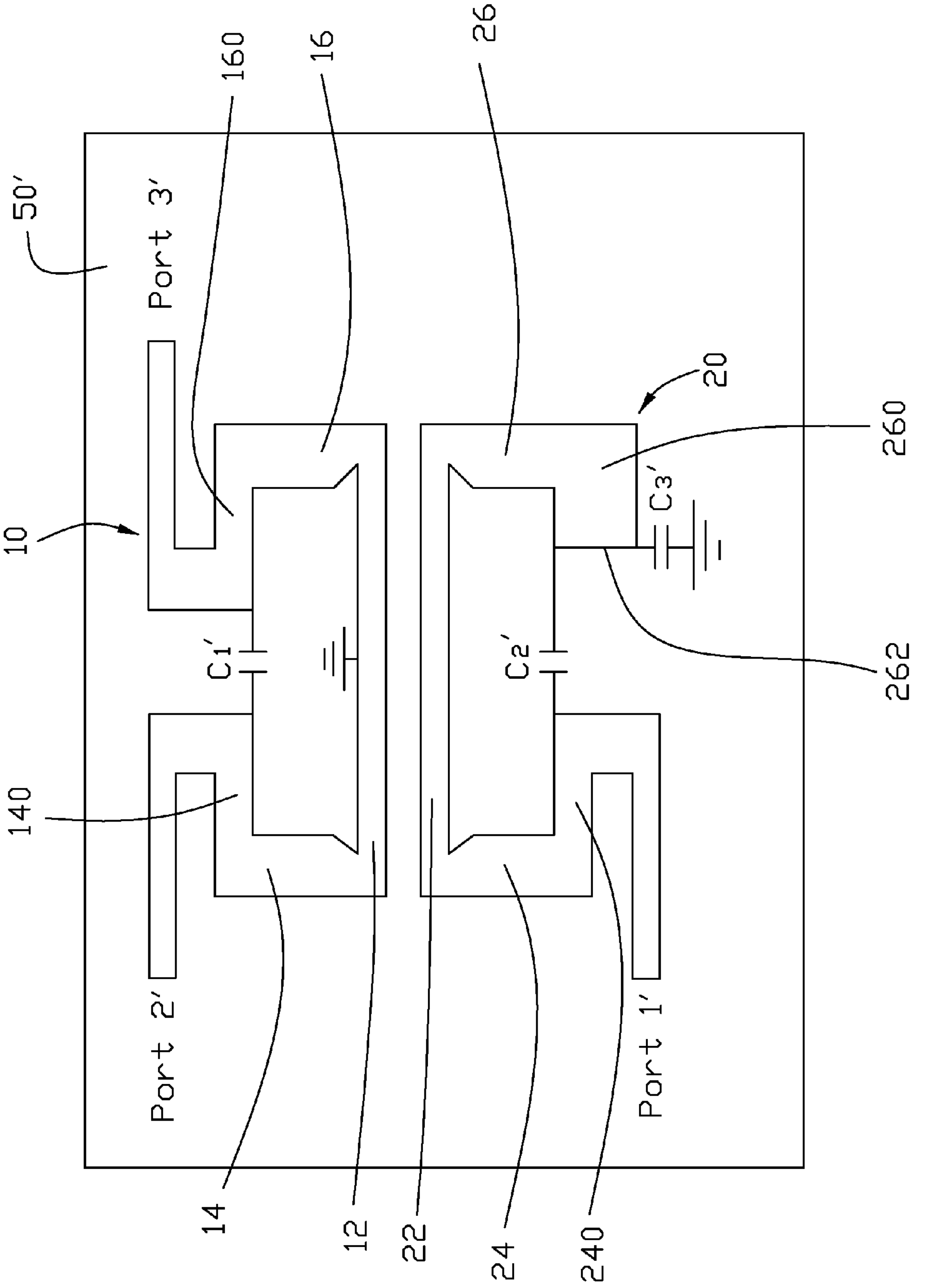
FIG. 1 (RELATED ART)
FIG. 1 is a schematic diagram of a conventional one-sixteenth (1/16) wavelength balun.
Figure 2:
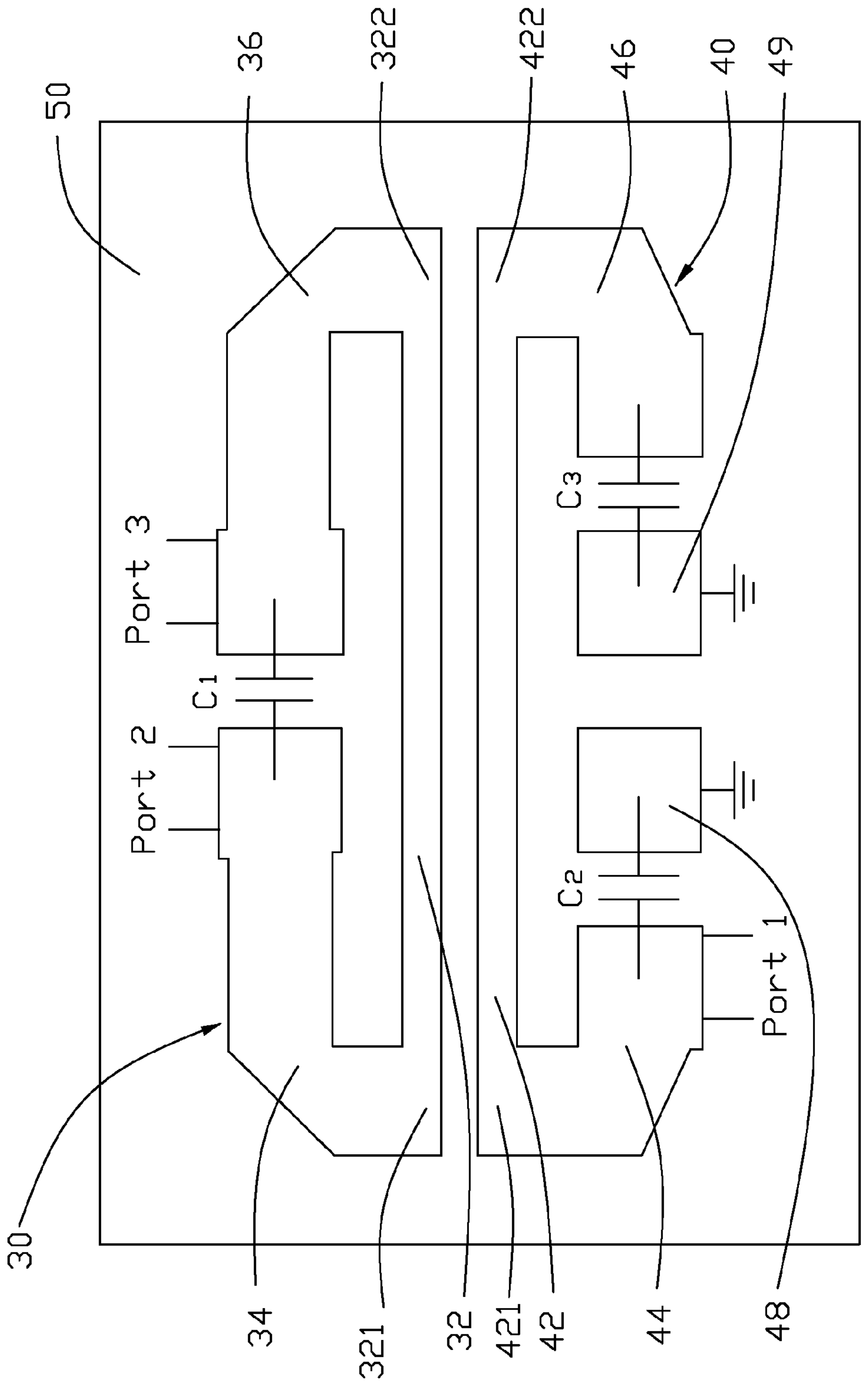
FIG. 2 is a schematic diagram of a balun of an exemplary embodiment of the present invention.

FIG. 2 is a schematic diagram of a balun of an exemplary embodiment of the present invention. In the exemplary embodiment, the balun is made of conductor. The conductor may be a copper line or other metals. The balun is operated at 2.4 GHz frequency band. The balun, disposed on a substrate 50, includes a first transforming part 30 and a second transforming part 40. The first transforming part 30 is symmetrical with respect to a central line thereof. The second transforming part 40 is symmetrical with respect to a central line thereof.

The first transforming part 30 includes a first coupled line 32, a first transmission line 34, a second transmission line 36, and a first capacitor C1. A width of the first coupled line 32 is less than that of the first transmission line 34 and that of the second transmission line 36. The first coupled line 32 has a first end 321 and a second end 322. The first transmission line 34 and the second transmission line 36 are both bent. The first transmission line 34, connected to the first end 321, includes a first balanced port 2. The second transmission line 36, connected to the second end 322, includes a second balanced port 3. The first capacitor C1, centrally disposed between ends of the first transmission line 34 and the second transmission line 36, connects the first balanced port 2 and the second balanced port 3. In the exemplary embodiment, the first capacitor C1 is a micro capacitor, and a capacitor value thereof is 1 pF.

In the exemplary embodiment, the first transmission line 34, the first coupled line 32, and the second transmission line 36 are connected in series, forming a first resonator. The first balanced port 2 and the second balanced port 3 are used for inputting two signals with a phase difference of 180 degrees.

The second transforming part 40 includes a second coupled line 42, a third transmission line 44, a fourth transmission line 46, a first line node 48, a second line node 49, a second capacitor C2, and a third capacitor C3. A width of the second coupled line 42 is less than that of the third transmission line 44 and that of the fourth transmission line 46. The second coupled line 42 is parallel to the first coupled line 32. The second coupled line 42 has a third end 421 and a fourth end 422. The third transmission line 44 and the fourth transmission line 46 are both bent. The third transmission line 44, connected to the third end 421, includes an unbalanced port 1. The fourth transmission line 46 is connected to the fourth end 422. In the exemplary embodiment, the unbalanced port 1 is used for outputting signals. The first line node 48 includes a first ground via. The second line node 49 includes a second ground via.

The second capacitor C2 connects the third transmission line 44 and the first line node 48. In the exemplary embodiment, the second capacitor C2 is a micro capacitor, and a capacitor value thereof is 1 pF. The third capacitor C3 connects the fourth transmission line 46 and the second line node 49. In the exemplary embodiment, the third capacitor C3 is a micro capacitor, and a capacitor value thereof is 1 pF. The micro capacitor C2 is aligned with the third capacitor C3.

The third transmission line 44, the second coupled line 42, and the fourth transmission line 46 are connected in series, forming a second resonator.

In the exemplary embodiment, lengths of the first coupled line 32 and the second coupled line 42 are substantially one-sixteenth (1/16) of a working wavelength of the balun. Matching impedances at the first balanced port 1, the second balanced port 2, and the unbalanced port 1 are substantially 50 ohm.

In other embodiments, the unbalanced port 1 may be used for inputting signals, and the first balanced port 2 and the second balanced port 3 may be used for outputting signals.

In the exemplary embodiment, neither of the first coupled line 32 and the second coupled line 42 include a ground via, as a result, lengths of the first and second resonators are reduced. Accordingly, the size of the balun is reduced.

Figure 3:
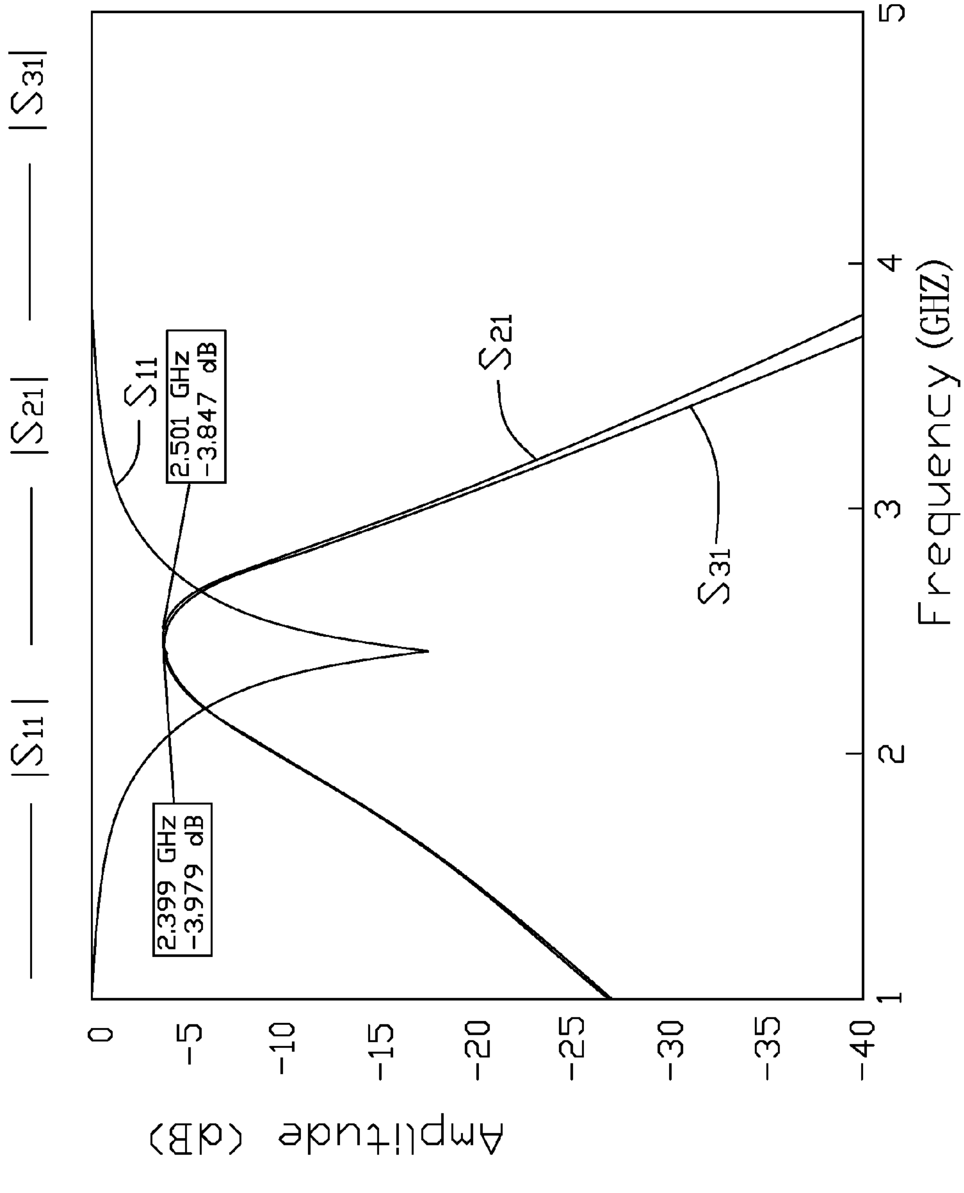
FIG. 3 is a graph of simulated results showing an insertion loss and a return loss from balanced ports to an unbalanced port of the balun of FIG. 2.

FIG. 3 is a graph of simulated results showing an insertion loss and a return loss from balanced ports to an unbalanced port of the balun of FIG. 2. In the figure, the vertical axis is the measured loss in dB. The horizontal axis shows the operating frequency of the balun from 1 GHZ to 5 GHz. The quadrant includes amplitudes of scattering parameters (S-parameters) $S_{11}$, $S_{21}$ and $S_{31}$.

The S-parameter $S_{21}$ indicates a relationship between an input power and an output power of a signal from the first balanced port 2 to the unbalanced port 1, and a corresponding mathematic function is as follows.

The output power/the input power (dB)=20×Log$|S_{21}|$.

The S-parameter $S_{31}$ indicates a relationship between an input power and an output power of a signal from the second balanced port 3 to the unbalanced port 1, and a corresponding mathematic function is as follows.

The output power/the input power (dB)=20×Log$|S_{31}|$.

When an electromagnetic signal travels through the balun, a part of the input power is returned to a source of the electromagnetic signal. The part of the input power returned to the source of the electromagnetic signal is called a return power. The S-parameter $S_{11}$ indicates a relationship between the input power and the return power of the electromagnetic signal traveling through the unbalanced port 1 of the balun, and a corresponding mathematic function is as follows.

The return power/the input power (dB)=20×Log$|S_{11}|$.

The curves $|S_{21}|$ and $|S_{31}|$ of FIG. 3 represent insertion losses, indicating how much signal power is transmitted to the unbalanced port 1. The bigger the insertion losses are, the higher the efficiency of transmission is. Accordingly, the balun has a better performance. As shown in FIG. 3, at the centre frequency of 2.4 GHz, the insertion losses are close to an ideal value of −3 dB, indicating that the balun has a good performance.

The curve $|S_{11}|$ represents a return loss, indicating how much signal power is returned to the first balanced port 2 and the second balanced port 3. The return loss should be less than −10 db in the designed frequency range. As shown in FIG. 3, the return loss is close to −16 dB, meaning that the return loss is very small. Thus, the balun has a good performance.

Figure 4:
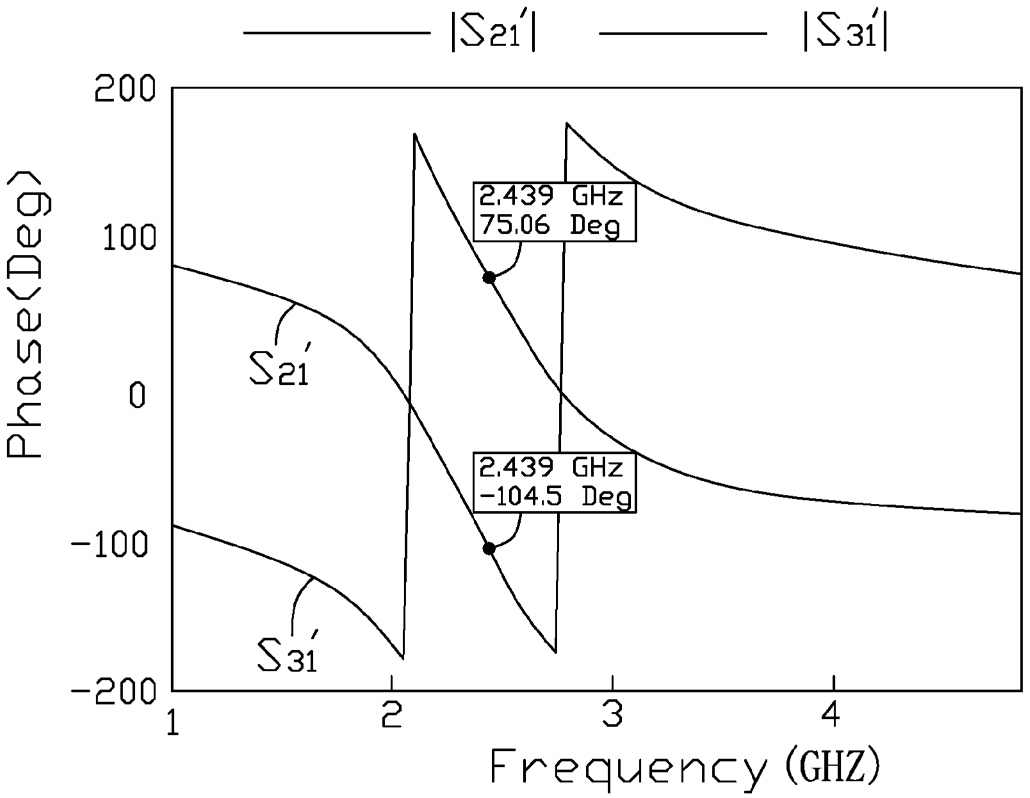
FIG. 4 is a graph of simulated results showing a phase difference between an input signal and an output signal of the balun of FIG. 2.

FIG. 4 is a graph of simulated results showing a phase difference between an input signal and an output signal of the balun of FIG. 2. The horizontal axis is the operating frequency of the balun in GHz. The vertical axis shows the phase in degrees (Deg). A signal, input from the first balanced port 2 and the second balanced port 3, is output to the unbalanced port 1. The curve $|S_{21}'|$ indicates a signal phase of the unbalanced port 1 compared to the first balanced port 2. The curve $|S_{21}'|$ shows a signal phase of the unbalanced port 1 compared to the second balanced port 3. As shown in FIG. 4, at the center frequency, the phase difference between the first balanced port 2 and the second balanced port 3 is substantially 180 degrees.

Figure 5:
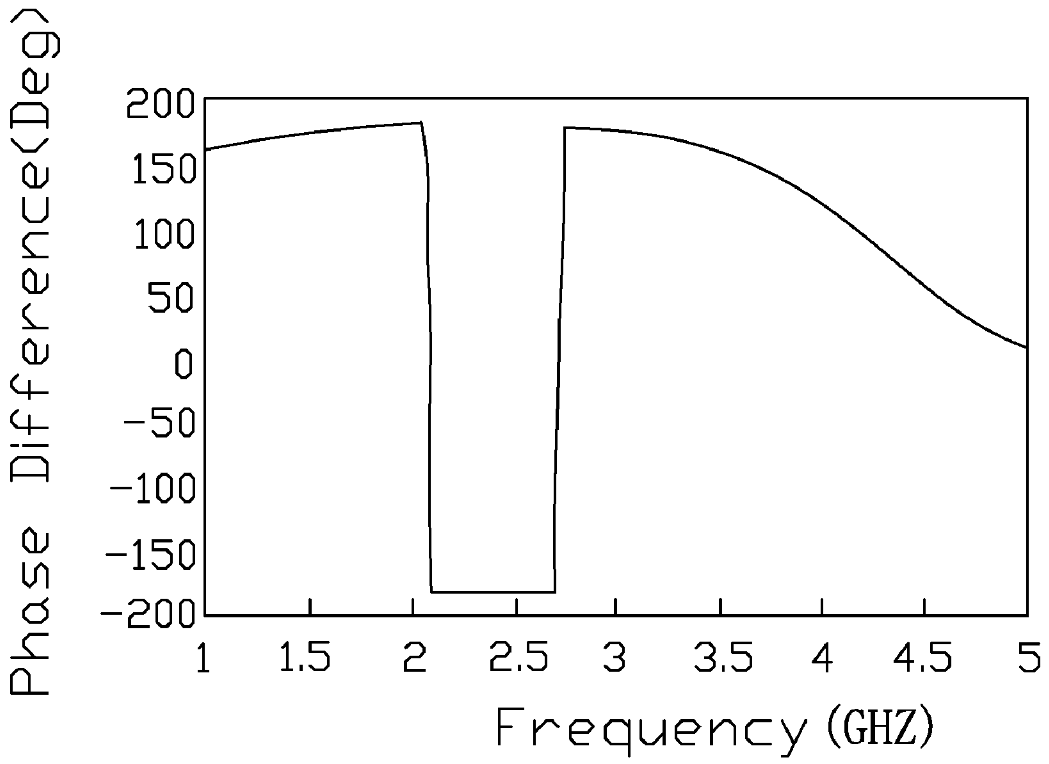
FIG. 5 is a graph of test results showing a phase difference at balanced ports of the balun of FIG. 2.

FIG. 5 is a graph of test results showing a phase difference at balanced ports of FIG. 2. As can be seen, within an operating frequency range from 2.2 to 2.7 GHz, the phase differences between the first balanced port 2 and the second balanced port 3 are all close to 180 degrees. Therefore, the balun has a good balanced input and output signal.

In the exemplary embodiment, neither of the first coupled line 32 and the second coupled line 42 has a ground via, so the second capacitor C2 and the third capacitor C3 are well arranged in the balun. Accordingly, the balun of this embodiment has a small insertion loss and a small return loss without affecting a phase difference between an input signal and an output signal. Thus, the size of the balun is reduced.

While various embodiments and methods of the present invention have been described above, it should be understood that they have been presented by way of example only and not by way of limitation. Thus the breadth and scope of the present invention should not be limited by the above-described exemplary embodiments, but should be defined only in accordance with the following claims and their equivalents.

What is claimed is:

1. A balun, comprising:

a first transforming part, comprising:

a first coupled line, comprising a first end and a second end;

a first transmission line, connected to the first end, comprising a first balanced port;

a second transmission line, connected to the second end, comprising a second balanced port; and a first capacitor, for connecting the first balanced port and the second balanced port; and a second transforming part, comprising:

a second coupled line, comprising a third end and a fourth end;

a third transmission line, connected to the third end, comprising an unbalanced port;

a fourth transmission line, connected to the fourth end, an extending end of the fourth transmission line spaced from that of the third transmission line;

a first line node, disposed between the extending ends of the third transmission line and the fourth transmission line;

a second capacitor, for connecting the third transmission line and the first line node;

a second line node, disposed between the extending ends of the third transmission line and the fourth transmission line and spaced from the first line node; and a third capacitor, for connecting the fourth transmission line and the second line node.

2. The balun as claimed in claim 1, wherein the second capacitor is aligned with the third capacitor.

3. The balun as claimed in claim 1, wherein the first line node comprises a ground via.

4. The balun as claimed in claim 3, wherein the second line node comprises a ground via.

5. The balun as claimed in claim 1, wherein the first transforming part is symmetrical with respect to a central line thereof

6. The balun as claimed in claim 5, wherein the second transforming part is symmetrical with respect to a central line thereof

7. The balun as claimed in claim 1, wherein the first transmission line, the first coupled line, and the second transmission line are connected in series, forming a first resonator.

8. The balun as claimed in claim 7, wherein the third transmission line, the second coupled line, and the fourth transmission line are connected in series, forming a second resonator.

9. The balun as claimed in claim 1, wherein the first balanced port and the second balanced port are used for inputting signals, and the unbalanced port is used for outputting signals.

10. The balun as claimed in claim 1, wherein the unbalanced port is used for inputting signals, and the first balanced port and the second balanced port are used for outputting signals.

11. The balun as claimed in claim 1, matching impedances at the first balanced port, the second balanced port, and the unbalanced port are substantially 50 ohm.

12. The balun as claimed in claim 1, lengths of the first coupled line and the second coupled line are substantially one-sixteenth of a working wavelength of the balun.

13. The balun as claimed in claim 1, wherein the first coupled line is parallel to the second coupled line.

14. The balun as claimed in claim 1, wherein a width of the first coupled line is less than that of first transmission line and that of the second transmission line.

15. The balun as claimed in claim 14, wherein a width of the second coupled line is less than that of the third transmission line and that of the fourth transmission line.

16. A balun assembly comprising:

a substrate; and a balun disposed on said substrate and comprising a first transforming part and a second transforming part neighboring said first transforming part and spaced therefrom, said first transforming port comprising a first coupling line extending beside and spaced from said second transforming part, and a first transmission line and a second transmission line respectively extending out of said first coupling line and away from said second transforming part in order to electrically connect with a corresponding balanced port, said second transforming part comprising a second coupling line extending beside and spaced from said first coupling line, and a third transmission line and a fourth transmission line respectively extending out of said second coupling line and away from said first transforming part, extending ends of said third and fourth transmission lines electrically connectable with at least one unbalanced port and spaced from each other, at least two grounded line nodes disnosed between said extending ends of said third and fourth transmission lines, each of said at least two line nodes spatially separate from another of said at least two line nodes and electrically connected to a corresponding one of said extending ends of said third and fourth transmission lines.

17. The balun assembly as claimed in claim 16, wherein said each of said at least two line nodes is electrically connected to said corresponding one of said extending ends of said third and fourth transmission lines via a capacitor.

18. A balun assembly comprising:

a substrate; and a balun disposed on said substrate and comprising two transforming parts neighboring and spaced from each other, one of said two transforming parts electrically connectable with two balanced ports and the other of said two transforming parts electrically connectable with at least one unbalanced port, said other of said two transforming parts comprising two transmission lines extending away from said first transforming part, respectively, and extending ends of said two transmission lines spaced from each other to electrically connect with said at least one unbalanced port, at least one grounded line node disposed between said extending ends of said two transmission lines and electrically connectable with at least a selective one of said extending ends of said two transmission lines via a capacitor, said at least grounded line node comprising two spaced grounded line nodes disposed between said extending ends of said two transmission lines, each of said two spaced line nodes being electrically connected with a corresponding one of said extending ends of said two transmission lines via a corresponding one of said capacitor.

19. The balun assembly as claimed in claim 16, wherein said at least two line nodes and said extending ends of said third and fourth transmission lines are aligned with one another.

* * * * *